(12) United States Patent
Lee et al.

(10) Patent No.: US 8,986,566 B2
(45) Date of Patent: Mar. 24, 2015

(54) THERMOELECTRIC MATERIAL, THERMOELECTRIC DEVICE USING THE SAME, AND METHOD OF MANUFACTURING THEREOF

(75) Inventors: Kyu-hyoung Lee, Yongin-si (KR); Sung-woo Hwang, Yongin-si (KR); Sang-il Kim, Yongin-si (KR); Sang-mock Lee, Yongin-si (KR); Kyung-han Ahn, Uijeongbu-si (KR)

(73) Assignee: Samsung Electronics Co., Ltd. (KR)

(*) Notice: Subject to any disclaimer, the term of this patent is extended or adjusted under 35 U.S.C. 154(b) by 176 days.

(21) Appl. No.: 13/490,824

(22) Filed: Jun. 7, 2012

(65) Prior Publication Data

US 2013/0105725 A1    May 2, 2013

(30) Foreign Application Priority Data

Oct. 26, 2011    (KR) .................. 10-2011-0110051

(51) Int. Cl.
 *H01L 35/16*  (2006.01)
 *C01B 19/00*  (2006.01)

(52) U.S. Cl.
 CPC .............. *C01B 19/002* (2013.01); *H01L 35/16* (2013.01); *C01P 2006/40* (2013.01)
 USPC .................. 252/62.3 T; 136/238; 136/240

(58) Field of Classification Search
 CPC ........................................ H01L 35/16
 USPC ................ 252/62.3 T; 136/238, 240
 See application file for complete search history.

(56) References Cited

U.S. PATENT DOCUMENTS

| 5,883,563 | A | 3/1999 | Horio et al. |
| 7,560,053 | B2 | 7/2009 | Imaoka et al. |
| 7,939,744 | B2 * | 5/2011 | Fukudome et al. ........ 136/236.1 |
| 2010/0258154 | A1 | 10/2010 | Heremans et al. |
| 2011/0100409 | A1 * | 5/2011 | Kim et al. ..................... 136/205 |

FOREIGN PATENT DOCUMENTS

| CN | 102403445 | * | 4/2012 |
| JP | 08111546 | A | 4/1996 |
| JP | 2002026404 | A | 1/2002 |
| JP | 2004014804 | A | 1/2004 |

OTHER PUBLICATIONS

Translation of CN 102403445, Apr. 4, 2012.*
Ovsyannikov et al, "Giant improvement of thermoelectric power factor of Bi2Te# under pressure", Jour. App. Physics, 104, 053713 (2008).*
Cui et al, "Proparation and thermoelectric properties of p-type (Ga2Te3)x–(Bo0.5Sb1,5Te3)1–x(x=0–02.) alloys prepared by spark plasma sintering", Intermetallics 15 (Jun. 2007), pp. 1466-1470.*

(Continued)

*Primary Examiner* — Carol M Koslow
(74) *Attorney, Agent, or Firm* — Cantor Colburn LLP

(57) ABSTRACT

A thermoelectric material including a composition according to Chemical Formula 1:

$$(Bi_{a-x}Sb_{1-a-y}M_b)_{2-i}(Te_cSe_{1-c})_{3-j} \quad \text{Chemical Formula 1}$$

wherein M is an element of Group 13, $0 \le a \le 1$, $0 < b \le 0.004$, $0 \le x \le b$, $0 \le y \le b$, $x+y=b$, $0 \le c \le 1$, $-0.2 \le i \le 0.2$, and $-0.2 \le j \le 0.2$.

18 Claims, 13 Drawing Sheets

(56) References Cited

OTHER PUBLICATIONS

Chemical abstract citation 70:62361—Seidove et al., "Physical Properties of a gallium telluride-bismuth telluride system", lzvestiya Akademii Nauk SSSR, Neorganicheskie Materialy, 1968, 4(12), 2195.*

Cui et al, "Crystal structure analysis and thermoelectric properties of p-type pseudo-binary (AI2Te3)x−(Bi0.5Sb1.5Te3)1−x(x=0−0.2) alloys prepared by spark plasma sintersing", Journal of alloys and Compounds, 460, May 2007, 426-431/.*

Rhyee, J-S. et al., "Peierls distortion as a route to high thermoelectric performance in In4Se3-d crystals", Nature, 459(2009), p. 965-968, with "Supplementary Information", Nature, (2009), p. 1-10.

Cui et al., "Preparation and thermoelectric properties of p-type (Ga2Te3)x−(Bi0.5Sb1.5Te3)1−x(x=0−0.2) alloys prepared by spark plasma sintering", Intermetallics, 15, 2007, pp. 1466-1470.

Cui et al., "Crystal structure analysis and thermoelectric properties of p-type pseudo-binary (AI2Te3)x(Bi0.5Sb1.5Te3)1−x(x=0~0.2) alloys prepared by spark plasma sintering", Journal of Alloys and Compounds, 460, 2008, pp. 426-431.

Drasar et al., "Figure of merit of quaternary (Sb0.75Bi0.25)2-xInxTe3 single crystals", Journal of Applied Physics, 104, 2008, pp. 023701-1-023701-4.

\* cited by examiner

THERMOELECTRIC MATERIAL, THERMOELECTRIC DEVICE USING THE SAME, AND METHOD OF MANUFACTURING THEREOF

CROSS-REFERENCE TO RELATED APPLICATIONS

This application claims priority to Korean Patent Application No. 10-2011-0110051, filed on Oct. 26, 2011, and all the benefits accruing therefrom under 35 U.S.C. §119, the content of which in its entirety, is herein incorporated by reference.

BACKGROUND

1. Field

The present disclosure relates to a thermoelectric material, a thermoelectric device using the thermoelectric material, and a method of manufacturing thereof.

2. Description of the Related Art

The thermoelectric effect is a reversible and direct method of converting energy between heat and electricity. The thermoelectric effect is a phenomenon that occurs due to the movement of charge carriers, specifically electrons and holes.

The Seebeck effect is the conversion of a temperature difference directly into electricity, and can be used for power generation using an electromotive force generated from a temperature difference between ends of a thermoelectric material. The Peltier effect is a phenomenon wherein when a current flows in a circuit, heat is generated in an upper junction and heat is absorbed in a lower junction. The Peltier effect can be used for cooling using the temperature difference formed between ends of the thermoelectric material when electrical current is applied. Also, the Seebeck effect and the Peltier effect are thermodynamically reversible. Thus the Seebeck effect and the Peltier effect are different from Joule heating in that Joule heating is not thermodynamically reversible.

Thermoelectric materials have been used to actively cool electronic devices, such as semiconductor equipment, in which the heat generation problem is not easily solved. Also, demand for improved temperature control, which can be provided using thermoelectric materials, has increased in fields that prefer precise temperature control, such as DNA analysis. Precise temperature control is difficult with compression-type cooling. Thermoelectric cooling provides many additional benefits. Thermoelectric cooling is eco-friendly, has no vibration, has low noise, and does not use a refrigerant gas that causes environmental pollution. Thus an improved thermoelectric material having increased cooling efficiency would be desirable for various cooling applications, such as commercial cooling, home refrigeration, and air conditioning. Also, if the thermoelectric material is disposed on a device that generates heat, such as an engine of an automobile or in an industrial plant, electricity may be generated using a temperature difference between ends of the thermoelectric material.

Thus there remains a need for an improved thermoelectric material.

SUMMARY

Provided is a thermoelectric material that provides increased thermoelectric performance by increasing a Seebeck coefficient without loss of electrical conductivity. Also provided is a thermoelectric device using the thermoelectric material, and a method of manufacturing the thermoelectric material.

Additional aspects will be set forth in part in the description which follows and, in part, will be apparent from the description.

According to an aspect, provided is a thermoelectric material including a composition according to Chemical Formula 1:

  Chemical Formula 1

$(Bi_{a-x}Sb_{1-a-y}M_b)_{2-i}(Te_cSe_{1-c})_{3-j}$ wherein M is an element of Group 13, $0 \le a \le 1$, $0 < b \le 0.004$, $0 \le x \le b$, $0 \le y \le b$, $x+y=b$, $0 \le c \le 1$, $-0.2 \le i \le 0.2$, and $-0.2 \le j \le 0.2$.

The thermoelectric material may have a charge density in a range from about $1 \times 10^{19}$ cm$^{-3}$ to about $10 \times 10^{19}$ cm$^{-3}$ at a temperature of 300 K.

In an embodiment wherein the thermoelectric material including a composition according to Chemical Formula 1 is a first thermoelectric material, a potential difference between the first thermoelectric material including a composition according to Chemical Formula 1 and a second thermoelectric material including a composition of Chemical Formula 1 in which a, c, x, y, i, and j are the same as a, c, x, y, i, and j of the first thermoelectric material and b of the second thermoelectric material is 0 may be in a range from about 0.1 eV to about 1 eV.

The thermoelectric material may have a figure of merit ZT in a range from about 1.1 to about 1.4 at about 300 K.

The thermoelectric material may be a sintered body or a powder.

According to another aspect, provided is a thermoelectric material including a composition according to Chemical Formula 2:

  Chemical Formula 2

$(Bi_{0.2-x}Sb_{0.8-y}M_b)_{2-i}Te_{3-j}$ wherein M is an element of Group 13, $0 < b \le 0.004$, $0 \le x \le b$, $0 \le y \le b$, $x+y=b$, $-0.2 \le i \le 0.2$, and $-0.2 \le j \le 0.2$.

According to another aspect, provided is a thermoelectric material of Chemical Formula 1 or Chemical Formula 2, wherein the thermoelectric material is an n-type semiconductor or a p-type semiconductor.

According to an aspect, provided is a method of manufacturing a thermoelectric material including a composition according to Chemical Formula 1:

  Chemical Formula 1

$(Bi_{a-x}Sb_{1-a-y}M_b)_{2-i}(Te_cSe_{1-c})_{3-j}$ wherein M is an element of Group 13, $0 \le a \le 1$, $0 < b \le 0.004$, $0 \le x \le b$, $0 \le y \le b$, $x+y=b$, $0 \le c \le 1$, $-0.2 \le i \le 0.2$, and $-0.2 \le j \le 0.2$, the method including: forming a mixture by contacting Bi, Sb, M, Te, and Se wherein a mole fraction of each of the Bi, Sb, M, Te, and Se are according to Chemical Formula 1; melting the mixture to form a molten mixture; cooling the molten mixture to form an alloy including a composition according to Chemical Formula 1; and grinding the alloy to manufacture the thermoelectric material.

The method may further include sintering the ground alloy.

In another aspect, disclosed is a device including the thermoelectric material disclosed above.

BRIEF DESCRIPTION OF THE DRAWINGS

These and/or other aspects, features, and advantages will become apparent and more readily appreciated from the following description of the embodiments, taken in conjunction with the accompanying drawings in which.

DETAILED DESCRIPTION

Figure 1:
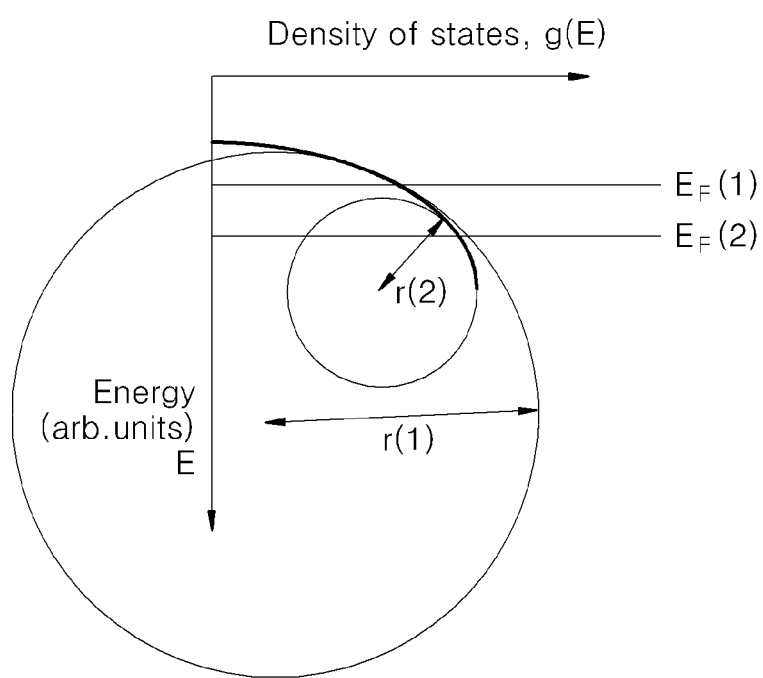
FIG. 1 is a graph of energy (arbitrary units) with respect to density of states showing the movement of a Fermi energy.

Reference will now be made in detail to various embodiments, examples of which are illustrated in the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A thermoelectric material according to an embodiment comprises a composition according to Chemical Formula 1.

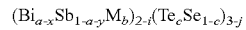  Chemical Formula 1

$(Bi_{a-x}Sb_{1-a-y}M_b)_{2-i}(Te_cSe_{1-c})_{3-j}$

In Chemical Formula 1 M is an element of Group 13 of the Periodic Table of the Elements, $0 \le a \le 1$, $0 < b \le 0.004$, $0 \le x \le b$, $0 \le y \le b$, $x+y=b$, $0 \le c \le 1$, $-0.2 \le i \le 0.2$, and $-0.2 \le j \le 0.2$.

A thermoelectric material, which can be used for cooling or in a heat pump at a temperature of about 300 K may have a composition of $(Bi_aSb_{1-a})_2(Te_cSe_{1-c})_3$. In a polycrystalline form, the bulk $(Bi_aSb_{1-a})_2(Te_cSe_{1-c})_3$ material has a figure of merit ZT of approximately 1 at a temperature of 300 K.

The figure of merit ZT describes the performance of a thermoelectric material. The figure of merit ZT is defined in Equation 1, and is referred to as a dimensionless figure of merit.

Equation 1

$$ZT = \frac{S^2 \sigma T}{\kappa} \quad (1)$$

In Equation 1, S is a Seebeck coefficient (which denotes a thermoelectric power generated at temperature difference of 1° C.), σ is electrical conductivity, T is absolute temperature, and κ is thermal conductivity. $S^2\sigma$ is a power factor. As shown in Equation (1), in order to increase the figure of merit ZT of a thermoelectric material, the Seebeck coefficient and the electrical conductivity, i.e., the power factor, are desirably increased and the thermal conductivity is desirably reduced. However, the Seebeck coefficient and the electrical conductivity are in a trade-off relationship. Therefore, when a value of one of the Seebeck coefficient and the electrical conductivity is increased by changing the carrier concentration, e.g., the electron or hole concentration, the value of the other is reduced. For example, a material having a high electrical conductivity has a low Seebeck coefficient, and a material having a high Seebeck coefficient has a low electrical conductivity. Because of the trade-off relationship between the Seebeck coefficient and the electrical conductivity, increasing the power factor by altering the Seebeck coefficient or electrical conductivity is difficult.

Attempts have been conducted to increase a Seebeck coefficient using a quantum confinement effect by forming a nano-structure such as a super-lattice thin film, a nano-wire, or quantum dots, and attempts have been made to reduce thermal conductivity by a phonon glass electron crystal ("PGEC") concept. The concept of increasing a Seebeck coefficient by the quantum confinement effect is that the density of states ("DOS") of a carrier in a material can be increased by the nano-structure to increase an effective mass of the carrier, increasing the Seebeck coefficient. In this case, the relationship between the thermal conductivity and the Seebeck coefficient is broken. Thus the Seebeck coefficient may be increased without significantly changing the electrical conductivity. The concept of reducing the electrical conductivity using the PGEC concept is to reduce the thermal conductivity without significantly reducing the electrical conductivity by blocking the movement of phonons, which carry heat, while not interrupting the movement of the charge carrier.

However, most of the high efficiency thermoelectric materials that use the quantum confinement effect and the PGEC concept that have been developed so far are nano-structured thin-films. Because of limitations of techniques for preparing bulk materials, there are a certain limits to the practical use of such thermoelectric materials.

While not wanting to be bound by theory, it is understood that in a thermoelectric material comprising a composition of Chemical Formula 1, an element M of Group 13, a small amount of which is included in the thermoelectric material, increases a Seebeck coefficient by changing a chemical potential thereof, and thus, the thermoelectric performance of the thermoelectric material is increased.

When a chemical potential of a thermoelectric material is changed, the Fermi energy is changed. When the Fermi energy is located on a point where energy change with respect to density of energy states is large, the electron effective mass is increased, and when the electron effective mass is increased, the Seebeck coefficient is increased. Equation 2 shows a relationship between DOS and the Seebeck coefficient.

$$S \sim \frac{d^2 \ln \varepsilon}{dk^2}\bigg|_{E=E_F} \quad (2)$$

Equation 2

In Equation 2, S is a Seebeck coefficient, ε is electron energy, k is DOS, and $E_F$ is Fermi energy. From Equation 2, it is seen that as the change of energy with respect to DOS is increased at Fermi energy, the Seebeck coefficient increases.

This relationship is shown in FIG. 1. FIG. 1 is a graph of energy E with respect to DOS g(E) and shows the movement of the Fermi energy $E_F$. Referring to FIG. 1, it is seen that when the Fermi energy $E_F$ moves from position $E_F(1)$ to position $E_F(2)$, the radius of curvature in the graph is reduced from r(1) to r(2). When the radius of curvature in the graph is reduced, the electron effective mass is increased, and accordingly, the Seebeck coefficient is increased.

Figure 2:
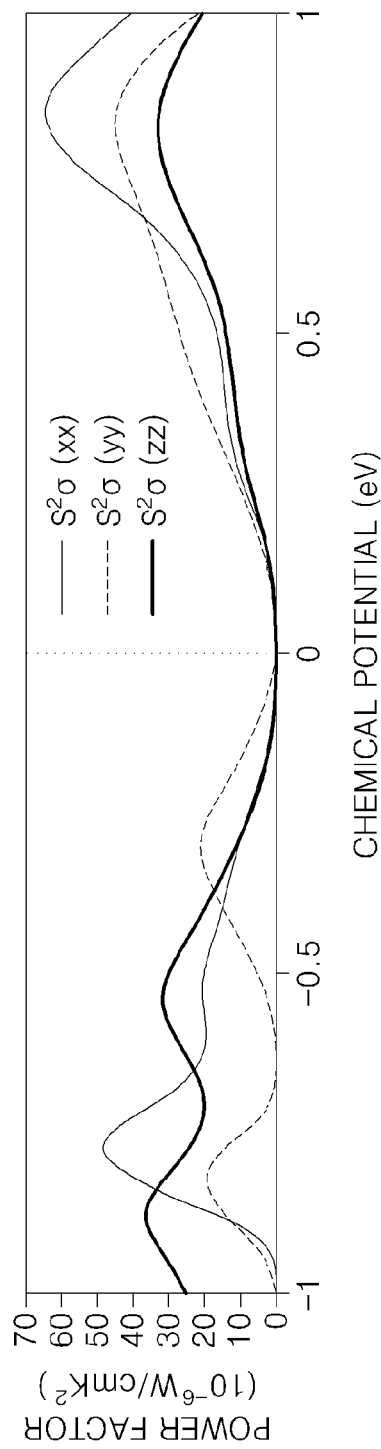
FIG. 2 is a graph of power factor ($10^{-6}$ watts/centimeter·Kelvin$^2$, $10^{-6}$ W/cmK$^2$) versus chemical potential (electron volts, eV) showing variations of a power factor in the x, y, and z directions of a crystal ($S^2\sigma(xx)$, $S^2\sigma(yy)$, and $S^2\sigma(zz)$, respectively), according to a chemical potential change of a thermoelectric material.
Figure 3A:
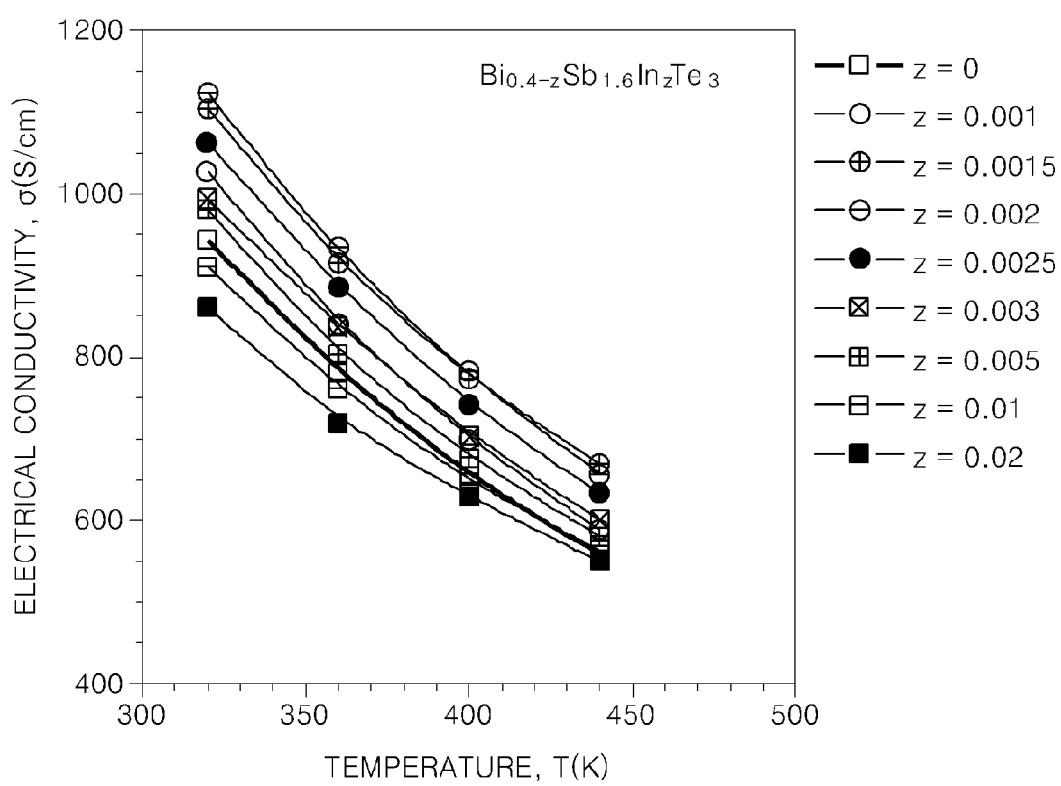
FIGS. 3A through 3E are graphs of electrical conductivity, σ (Siemens/centimeter, S/cm); Seebeck coefficient, S (microvolts per Kelvin, μV/K); power factor, PF (Watts/microKelvin$^2$, W/μK$^2$); thermal conductivity, (Watts/milliKelvin, W/mK); and figure of merit (ZT), respectively, versus temperature (Kelvin, K) of thermoelectric materials according to Examples 1 through 8 and a Comparative Example.
Figure 3B:
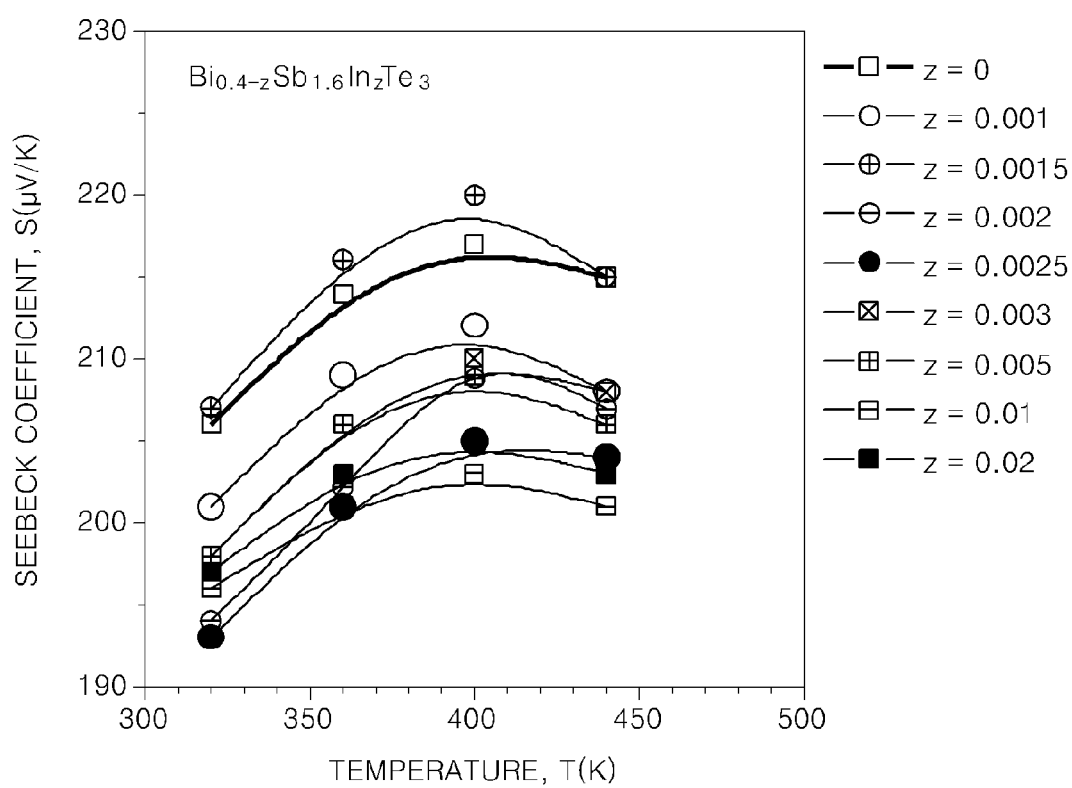
Figure 3C:
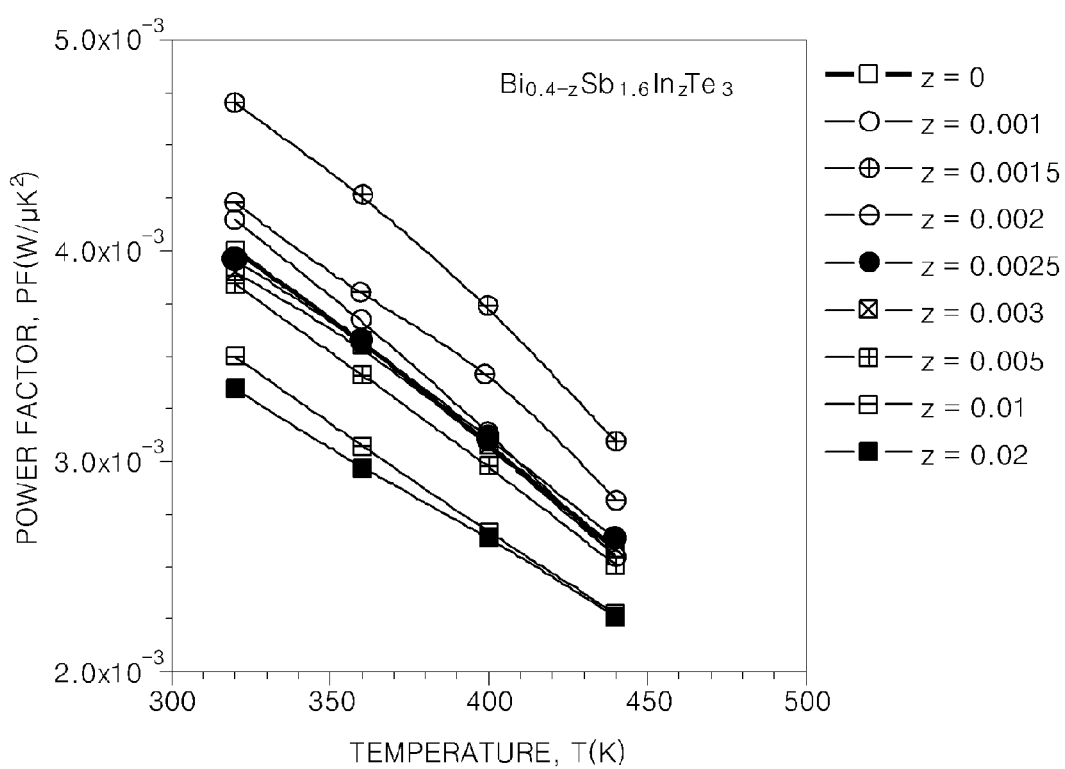
Figure 3D:
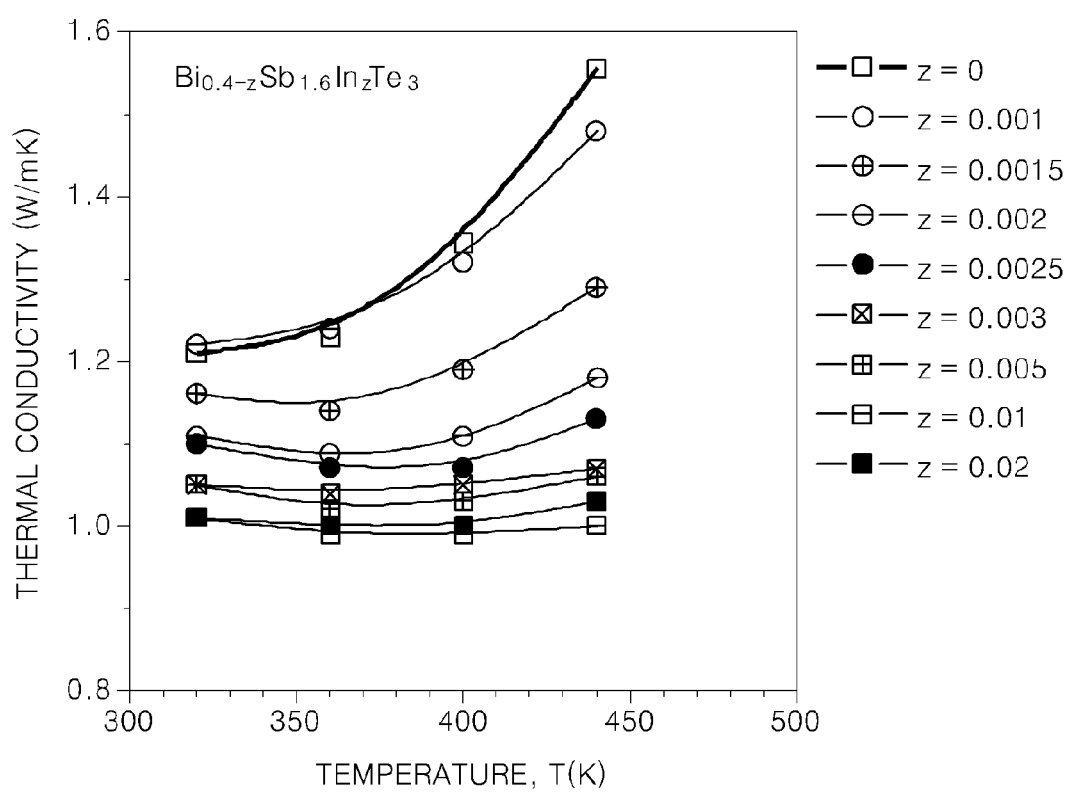
Figure 3E:
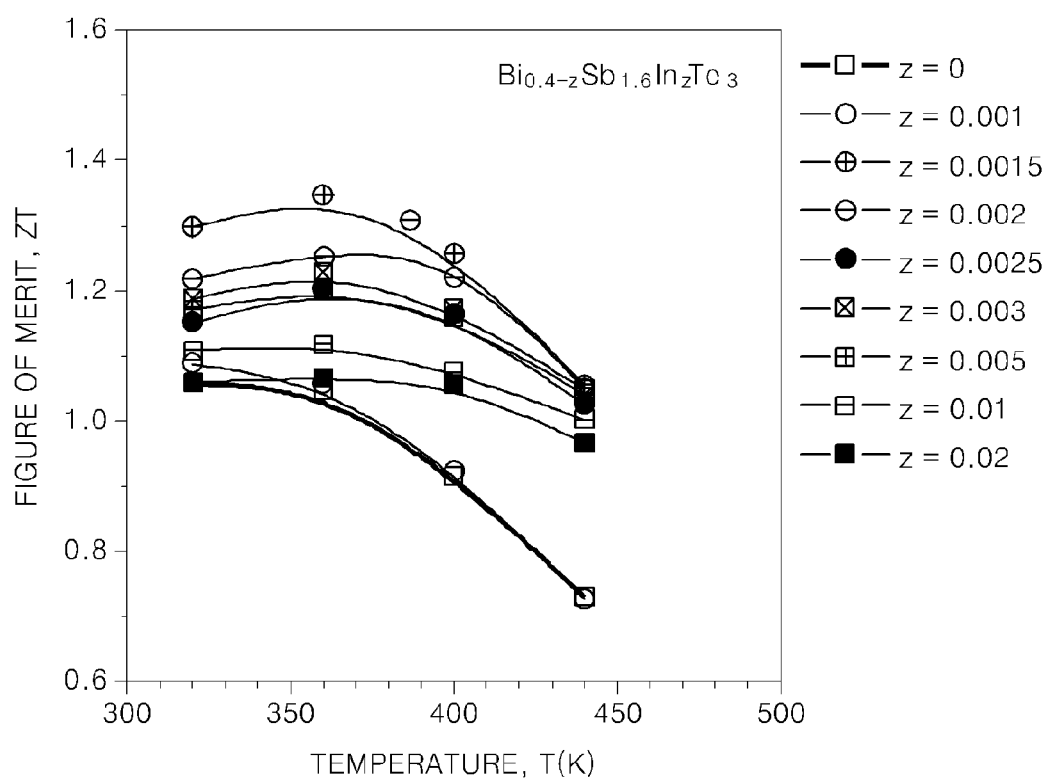
Figure 4A:
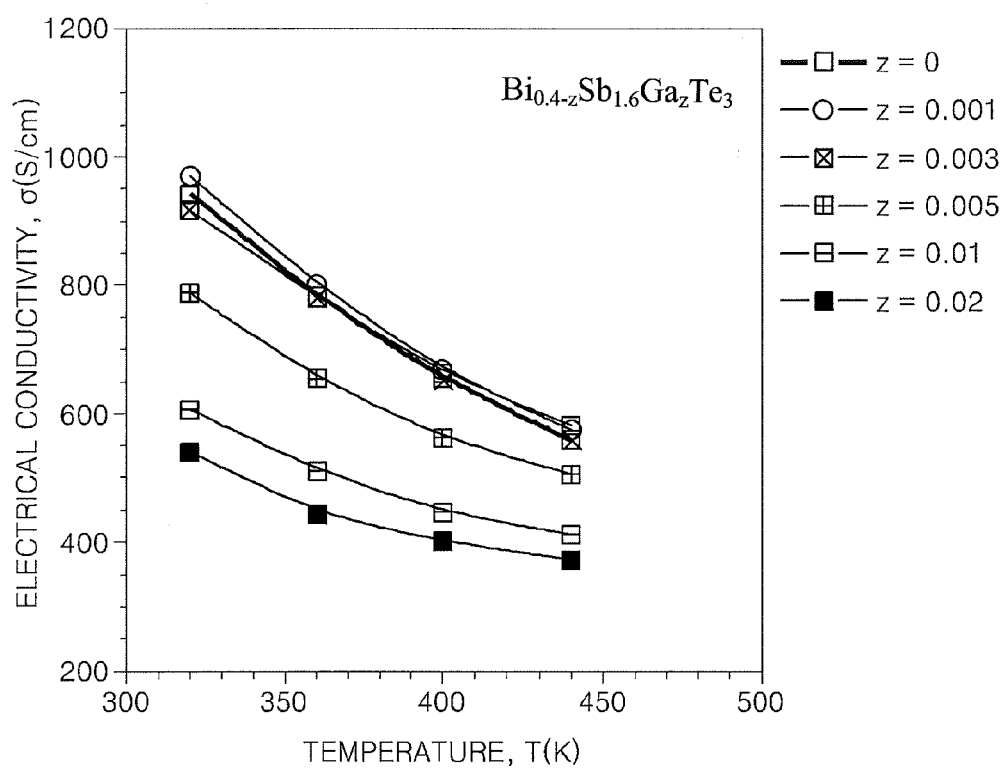
FIGS. 4A through 4E are graphs showing measured results of electrical conductivity, σ (Siemens/centimeter, S/cm); Seebeck coefficient, S (microvolts per Kelvin, μV/K); power factor, PF (Watts/microKelvin$^2$, W/μK$^2$); thermal conductivity, (Watts/milliKelvin, W/mK); and figure of merit (ZT), respectively, versus temperature of thermoelectric materials according to Examples 9 through 13 and the Comparative Example.
Figure 4B:
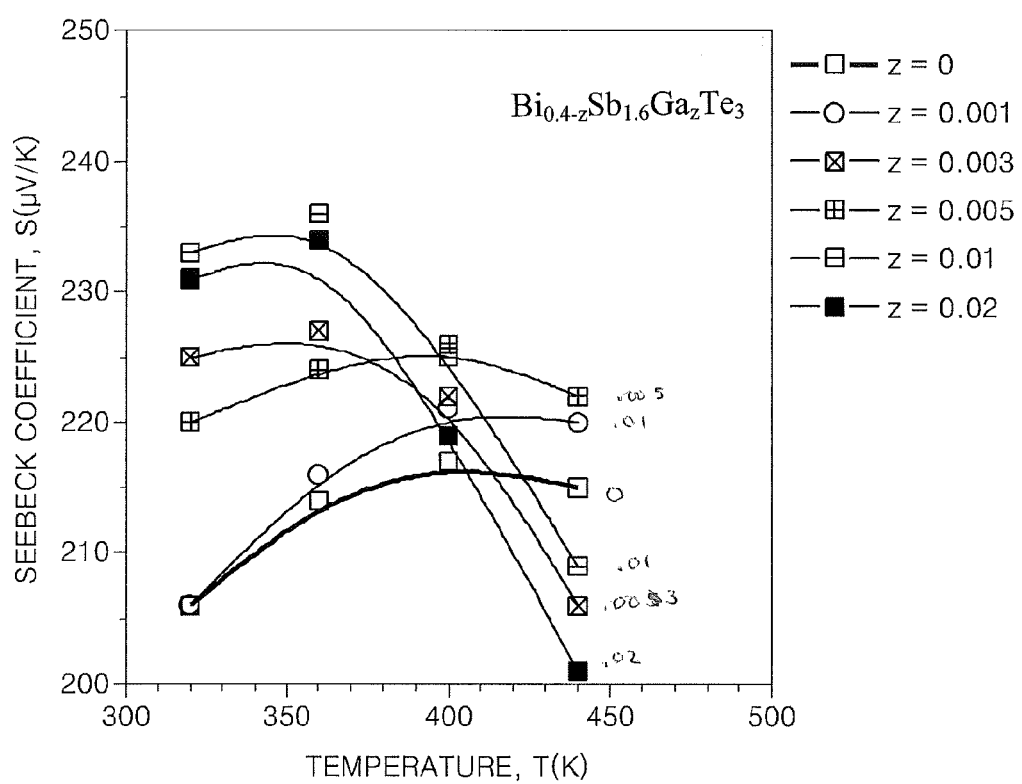
Figure 4C:
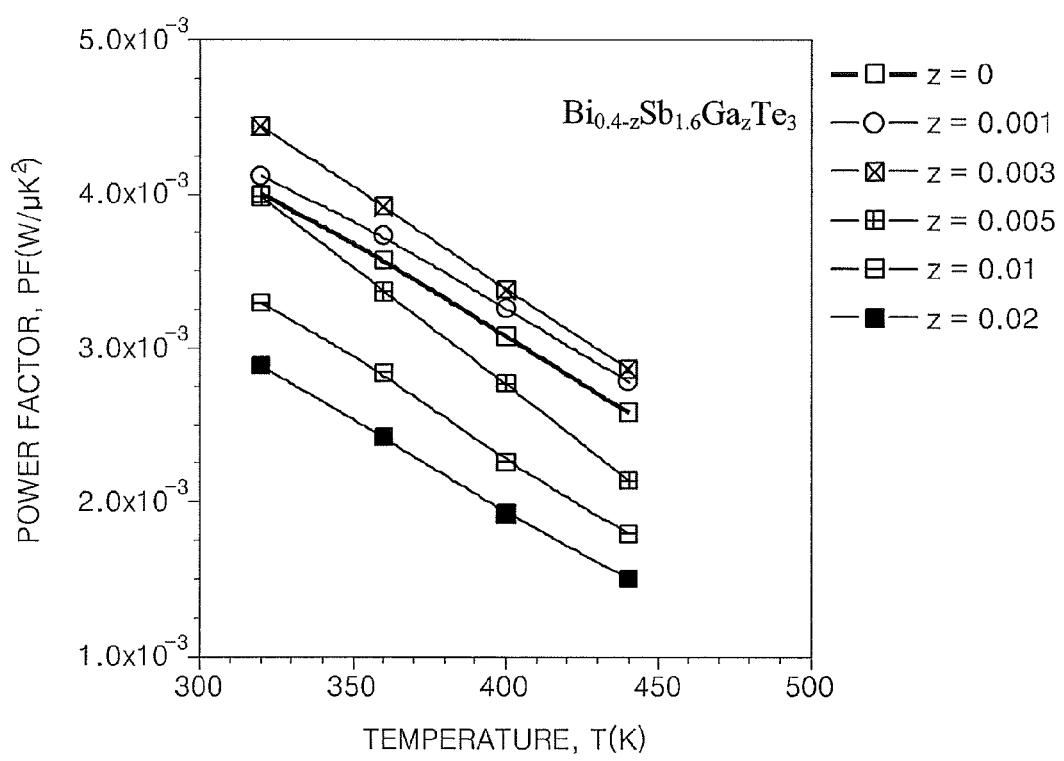
Figure 4D:
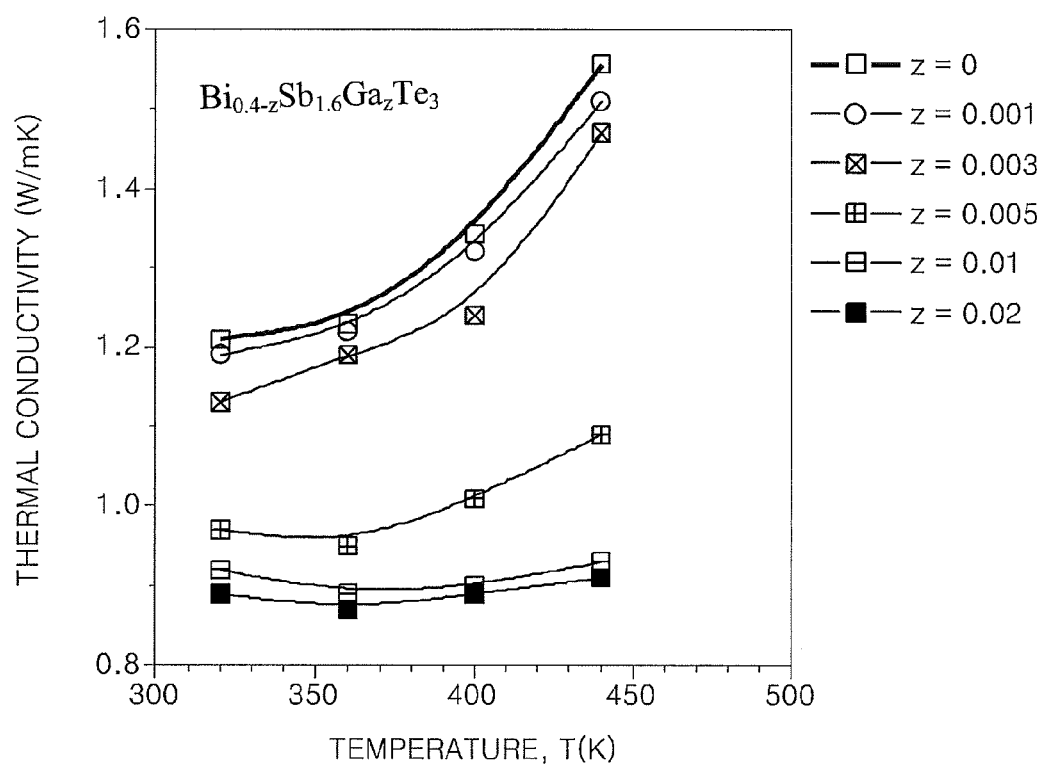
Figure 4E:
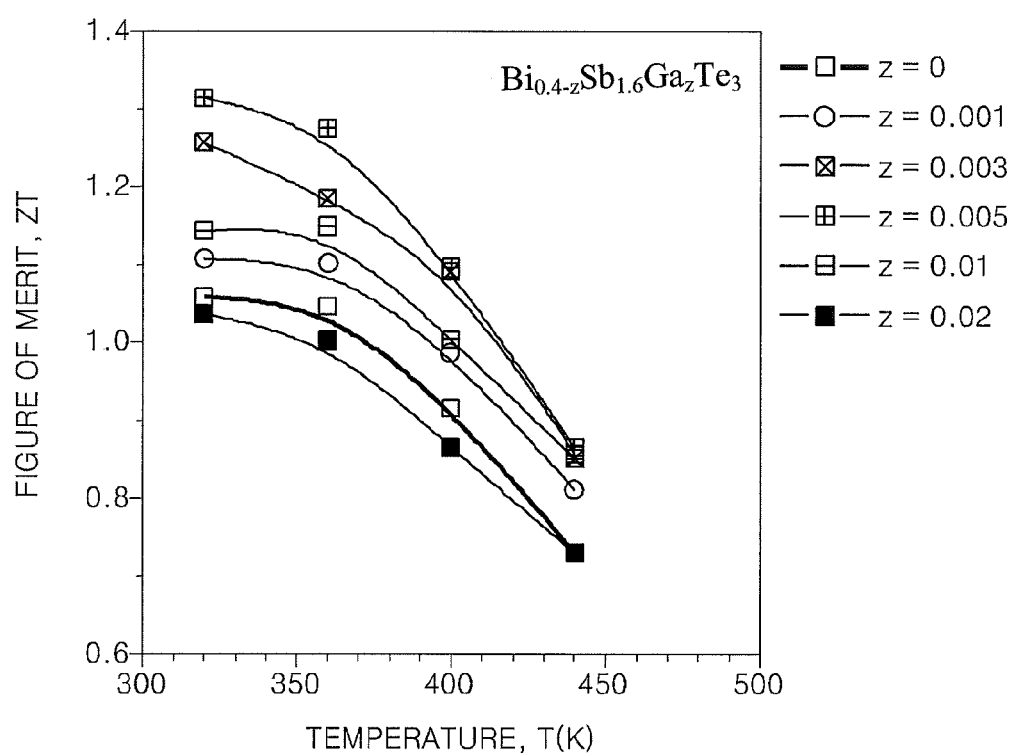

FIG. 2 is a graph showing variations of a power factor according to changes of chemical potential of thermoelectric materials in the x, y, and z directions (the ($S^2\sigma(xx)$, $S^2\sigma(yy)$, and $S^2\sigma(zz)$, respectively), as is further described in "Peierls distortion as a route to high thermoelectric performance in $In_4Se_{3-\delta}$ crystals", Nature, 459 (2009), p 965-968, the content of which in its entirety is herein incorporated by reference. The graph of FIG. 2 is a result of calculation of the variation of a power factor according to the variation of chemical potential of $In_4Se_{3-\delta}$ (δ=0.25), and shows that there is a chemical potential at which the power factor increases.

In a thermoelectric material comprising the composition of Chemical Formula 1, an element M of Group 13 may be Al, Ga, In, or Tl, or a combination thereof. In an embodiment, M is Ga or In. The elements of Group 13 may readily substitute for Bi or Sb, which are elements of Group 15 and located close to Group 13 in the Periodic Table. Also, and while not wanting to be bound by theory, it is understood that in a thermoelectric material comprising the composition of Chemical Formula 1, an element M of Group 13, a small amount of which is included in the thermoelectric material, changes a charge density and a chemical potential thereof by substituting Bi or Sb.

Also, the small amount of an element M of Group 13 that is added to the thermoelectric material may minutely control the chemical potential of the thermoelectric material, and accordingly, may minutely control the location of the Fermi energy $E_F$. As shown in FIG. 1, the electrical conductivity, the Seebeck coefficient, and the power factor of a thermoelectric material may be substantially increased by moving the Fermi energy $E_F$ to a location where the change of energy with respect to DOS is larger.

For example, in a thermoelectric material comprising the composition of Chemical Formula 1, mole fraction of the element M of Group 13 may be in a range from about 0.001 to about 0.008, specifically 0.002 to about 0.007, more specifically 0.003 to about 0.006. In Chemical Formula 1 the value of b may be about 0<b≤0.004, specifically about 0.0005≤b≤0.004, more specifically about 0.001<b≤0.003. When the amount of the element M of Group 13 is in the above range, the chemical potential may be desirably controlled.

For example, when the mole fraction element M of Group 13 is greater than the foregoing range, that is a mole fraction greater than 0.01 is used, the element M of Group 13 may form point defects in the thermoelectric material. The point defects may undesirably scatter heat, reducing thermal conductivity. Also, a power factor may be reduced because electrical conductivity is also reduced. Therefore, thermoelectric performance may not be greatly increased if the mole fraction element M of Group 13 is greater than the foregoing range. In an embodiment, a small amount of an element M of Group 13 is included in the thermoelectric material to increase a Seebeck coefficient to select the chemical potential and the Fermi energy $E_F$, thereby increasing thermoelectric performance of the thermoelectric material.

In an embodiment, a may be 0≤a≤1, specifically 0.1≤a≤0.9, more specifically 0.2≤a≤0.8; 0≤c≤1, specifically 0.1≤c≤0.9, more specifically 0.2≤c≤0.8; −0.2≤i≤0.2, specifically −0.15≤i≤0.15, more specifically −0.1≤i≤0.1; and −0.2≤j≤0.2, specifically −0.15≤j≤0.15, more specifically −0.1≤j≤0.1.

A charge density of a thermoelectric material comprising the composition of Chemical Formula 1 may have a range from about $1\times10^{18}$ $cm^{-3}$ to about $10\times10^{20}$ $cm^{-3}$, specifically about $1\times10^{19}$ $cm^{-3}$ to about $10\times10^{19}$ $cm^{-3}$, more specifically about $2\times10^{19}$ $cm^{-3}$ to about $10\times10^{19}$ $cm^{-3}$ at a temperature of 300 K. In the above range of charge density, a thermoelectric material comprising the composition of Chemical Formula 1 may have desirably improved thermoelectric performance.

When a thermoelectric material comprising the composition of Chemical Formula 1 is compared to a thermoelectric material comprising the same composition of Chemical Formula 1 except that the element M of Group 13 is not included, that is b=0, the thermoelectric material comprising the composition of Chemical Formula 1 has a potential difference of 0.1 electron volts (eV) to 1 eV, and in some Embodiments, 0.1 eV through 0.6 eV, specifically 0.2 eV to 0.5 eV. While not wanting to be bound by theory, it is understood that the difference in the chemical potential may result in the change of the Fermi energy. Also, when the chemical potential difference is in the above range, a thermoelectric material comprising the composition of Chemical Formula 1 may have the above range of charge density, and thus, may have improved thermoelectric performance.

A thermoelectric material comprising the composition of Chemical Formula 1 may have a figure of merit ZT in a range from about 1.1 to about 1.4, specifically about 1.15 to about 1.35, more specifically about 1.2 to about 1.3 at room temperature (i.e., at 300 K) by introducing an element M of Group 13 to increase the Seebeck coefficient.

The thermoelectric material comprising the composition of Chemical Formula 1 may be in the form of a powder or a monolith, such as a sintered body. A monolith of the thermoelectric material may have various shapes, such as a rectilinear, circular, tubular, or cylindrical shape. When the thermoelectric material is a sintered body, the thermoelectric material may be in the form of a bulk material or a thin-film. When the thermoelectric material is a bulk material, the thermoelectric material may have any appropriate shape, such as a rectilinear, circular, tubular, or cylindrical shape.

A thermoelectric material according to another embodiment comprises a composition of Chemical Formula 1 according to Chemical Formula 2.

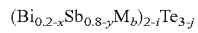

$(Bi_{0.2-x}Sb_{0.8-y}M_b)_{2-i}Te_{3-j}$     Chemical Formula 2

In Chemical Formula 2 M is an element of Group 13, $0<b\leq0.004$, $0\leq x\leq b$, $0\leq y\leq b$, $x+y=b$, $-0.2\leq i\leq0.2$, and $-0.2\leq j\leq0.2$.

In an embodiment M may be Ga or In.

In an embodiment, i may be $-0.15\leq i\leq0.15$, specifically $-0.1\leq i\leq0.1$; and j may be $-0.15\leq j\leq0.15$, specifically $-0.1\leq j\leq0.1$.

An embodiment wherein b is $0.0005\leq b\leq0.004$ is specifically mentioned.

The thermoelectric material comprising the composition of Chemical Formula 2 may have a charge density in a range from about $1\times10^{18}$ cm$^{-3}$ to about $10\times10^{20}$ cm$^{-3}$, specifically about $1\times10^{19}$ cm$^{-3}$ to about $10\times10^{19}$ cm$^{-3}$, more specifically about $2\times10^{19}$ cm$^{-3}$ to about $10\times10^{19}$ cm$^{-3}$ at room temperature, i.e., at 300 K.

A thermoelectric material comprising the composition of Chemical Formula 2 may have a figure of merit ZT in a range from about 1.1 to about 1.4, specifically about 1.15 to about 1.35, more specifically about 1.2 to about 1.3 at room temperature.

The thermoelectric device according to another embodiment may comprise a first electrode, a second electrode, and an n-type semiconductor or a p-type semiconductor between the first and second electrodes. The n-type semiconductor or the p-type semiconductor is a thermoelectric material comprising a composition of Chemical Formula 1 or Chemical Formula 2.

A method of manufacturing a thermoelectric material according to an embodiment will now be further disclosed.

First, a mixture is formed by contacting Bi, Sb, M, Te, and Se according to the mole fractions of Chemical Formula 1.

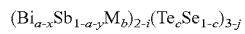

$(Bi_{a-x}Sb_{1-a-y}M_b)_{2-i}(Te_cSe_{1-c})_{3-j}$     Chemical Formula 1

In Chemical formula 1 M is an element of Group 13, and $0\leq a\leq1$, $0<b\leq0.004$, $0\leq x\leq b$, $0\leq y\leq b$, $x+y=b$, $0\leq c\leq1$, $-0.2\leq i\leq0.2$, and $-0.2\leq j\leq0.2$.

Next, an alloy of $(Bi_{a-x}Sb_{1-a-y}M_b)_{2-i}(Te_cSe_{1-c})_{3-j}$ is formed by heat treating the mixture. In order form an alloy, an ampoule method, an arc melting method, or a solid state reaction method may be used, for example. The ampoule method includes disposing the elements in a quartz tube or a metal ampoule, sealing the quartz tube or the metal ampoule in a vacuum, and heating the quartz tube or the metal ampoule to melt the elements. The arc melting method includes forming a specimen by melting the elements in a chamber with an arc discharge under an inert gas atmosphere. The solid state reaction method includes processing a powder of the elements into a pellet, e.g., by compacting in a die to form a pellet, and then heat treating the pellet or heat treating a mixture of the powdered elements to sinter the elements. The composition according to Chemical Formula 1 may also be a polycrystalline material, and the polycrystalline material may be formed by the above methods.

Also, in order to form the alloy, the polycrystalline material, or a crystalline material a metal flux method, a Bridgeman method, an optical floating zone method, or a vapor transport method may be used. In the metal flux method, a combination of the elements for forming the composition of Chemical formula 1 and an element that provides a flux in which the elements for forming the composition of Chemical formula 1 readily grow a crystal at a high temperature are placed in a crucible, and the crystal is grown by heat treating the combination of elements at the high temperature, e.g., 600° C. to 1200° C. In the Bridgeman method, after the combination of elements is placed in a crucible, the combination of elements is heated until the elements for forming the composition of Chemical formula 1 at an edge of the crucible are dissolved, and crystals are grown by passing the entirety of the elements for forming the composition of Chemical formula 1 through a high temperature region while locally by moving the elements for forming the composition of Chemical formula 1 through the high temperature region. In the optical floating zone method, after the elements for forming the composition of Chemical formula 1 are formed in a rod shape to provide a seed rod and a feed rod, crystals are grown by slowly pulling a melted portion of the feed rod upwards while locally melting the feed rod at a high temperature by focusing light on the feed rod. In the vapor transport method, after elements for forming the composition of Chemical formula 1 are placed at a lower side of a quartz tube, a portion of the elements for forming the composition of Chemical formula 1 is heated to maintain an upper part of the quartz tube at a low temperature, and then crystals are grown by generating a solid state reaction while the elements for forming the composition of Chemical formula 1 vaporize. An alloy, a polycrystalline material, or a single crystalline material may be grown using the above methods.

Next, a densification process may be performed by sintering the above alloy. Prior to performing the densification process, an operation of forming a powder may be performed by grinding the alloy. For example, the alloy may be ground by using a ball mill. The grinding may provide a powder having an average particle size of about 0.01 micrometers (μm) to about 100 μm, specifically about 0.5 μm to about 50 μm, more specifically about 1 μm to about 25 μm. After grinding the alloy, a uniform particle size may be provided by sorting the ground alloy with a sieve, such as a sieve having a mesh of about 100 to about 500, specifically about 120 to about 450, more specifically about 200 to about 325. After sieving, the powder may have a particle size of about 0.01 μm to about 50 μm, specifically about 0.1 μm to 25 μm, more specifically about 1 μm to about 10 μm, or a particle diameter of 50 microns or less. In an embodiment 98% of the particles are between about 1 μm and about 50 μm, more specifically about 2 μm and about 40 μm, more specifically about 4 μm and about 30 μm.

The densification process may be performed using a hot press method, a spark plasma sintering method, or a hot forging method. The hot press method is a method of molding a material, e.g., a powder, at a high temperature to provide a selected shape, for example, molding in a range from about 250° C. to about 650° C., specifically about 300° C. to about 550° C., more specifically about 350° C. to about 500° C. The molding may be performed at a high pressure, for example, in a range from about 30 megaPascals (MPa) to about 300 MPa, specifically about 40 MPa to about 280 MPa, more specifically about 50 MPa to about 260 MPa. The spark plasma sintering method is a method of sintering a material, e.g., a powder, in a short period of time by applying a high current, for example, a current in a range from about 50 amperes (A) to about 5000 A, specifically 60 A to about 4500 A, more specifically 70 amperes (A) to about 4000 A, under a pressure, for example, in a range from about 30 MPa to about 300 MPa, specifically about 40 MPa to about 250 MPa, more specifically about 50 MPa to about 200 MPa. The hot forging method is a method of hot pressing, e.g., extrusion at a high temperature, of a powder at a temperature, for example, in a range from about 250° C. to about 650° C., specifically about 300° C. to about 550° C., more specifically about 350° C. to about 500° C. when the powder compound is press molded.

EXAMPLES

Exemplary embodiments will now be disclosed in further detail. The present disclosure is not limited thereto.

Examples 1 Through 8

Manufacture of $Bi_{0.4-z}In_zSb_{1.6}Te_3$

Examples 1-8 are summarized in Table 1.

TABLE 1.

| Example | z | Alloy |
| --- | --- | --- |
| Example 1 | 0.001 | $Bi_{0.399}In_{0.001}Sb_{1.6}Te_3$ |
| Example 2 | 0.0015 | $Bi_{0.3985}In_{0.0015}Sb_{1.6}Te_3$ |
| Example 3 | 0.002 | $Bi_{0.398}In_{0.002}Sb_{1.6}Te_3$ |
| Example 4 | 0.0025 | $Bi_{0.3975}In_{0.0025}Sb_{1.6}Te_3$ |
| Example 5 | 0.003 | $Bi_{0.397}In_{0.003}Sb_{1.6}Te_3$ |
| Example 6 | 0.005 | $Bi_{0.395}In_{0.005}Sb_{1.6}Te_3$ |
| Example 7 | 0.01 | $Bi_{0.39}In_{0.01}Sb_{1.6}Te_3$ |
| Example 8 | 0.02 | $Bi_{0.38}In_{0.02}Sb_{1.6}Te_3$ |

To prepare the alloys of Examples 1 to 8, Bi, In, Sb, and Te were weighed and mixed to form eight mixtures in which the mole ratio of Bi:In:Sb:Te was 0.4-z:z:1.6:3 wherein z=0.001, 0.0015, 0.002, 0.0025, 0.003, 0.005, 0.01, and 0.02, respectively. The above eight mixtures were each placed in a quartz tube having a diameter of 12 millimeters (mm) and sealed at a vacuum of $10^{-3}$ Torr. The above mixtures were heated in a rocking furnace to melt the mixtures by maintaining the rocking furnace at 800° C. for 10 hours after placing the sealed quartz tube in the rocking furnace. Ingots of $Bi_{0.4-z}In_zSb_{1.6}Te_3$ alloy were formed by cooling the melted mixtures. The ingots of $Bi_{0.4-z}In_zSb_{1.6}Te_3$ alloy were each ground in a ball mill and powders of $Bi_{0.4-z}In_zSb_{1.6}Te_3$ (wherein z=0.001, 0.0015, 0.002, 0.0025, 0.003, 0.005, 0.01, and 0.02, respectively) having a diameter of 45 micrometers (μm) or less were sorted using a 325 mesh sieve.

The $Bi_{0.4-z}In_zSb_{1.6}Te_3$ powders were sintered at a temperature of 480° C. for 5 minutes under a pressure of 70 megaPascals (MPa) using a spark plasma sintering method, and then bulk thermoelectric materials of the formula $Bi_{0.4-z}In_zSb_{1.6}Te_3$ (wherein z=0.001, 0.0015, 0.002, 0.0025, 0.003, 0.005, 0.01, and 0.02, respectively) were formed in a cylindrical shape having a diameter of 10 mm and a thickness (i.e., height) of 12 mm.

Examples 9 Through 13

Manufacture of $Bi_{0.4-z}Ga_zSb_{1.6}Te_3$

Examples 9-13 are summarized in Table 2.

TABLE 2.

| Example | z | Alloy |
| --- | --- | --- |
| Example 9 | 0.001 | $Bi_{0.399}Ga_{0.001}Sb_{1.6}Te_3$ |
| Example 10 | 0.003 | $Bi_{0.397}Ga_{0.003}Sb_{1.6}Te_3$ |
| Example 11 | 0.005 | $Bi_{0.395}Ga_{0.005}Sb_{1.6}Te_3$ |
| Example 12 | 0.01 | $Bi_{0.39}Ga_{0.01}Sb_{1.6}Te_3$ |
| Example 13 | 0.02 | $Bi_{0.38}Ga_{0.02}Sb_{1.6}Te_3$ |

Bulk thermoelectric materials of the formula $Bi_{0.4-z}Ga_zSb_{1.6}Te_3$ were manufactured using the same method used in Examples 1 through 8 except that mixtures of Bi, Ga, Sb, and Te (wherein z=0.001, 0.003, 0.005, 0.01, and 0.02, respectively) having a mole ratio of Bi:Ga:Sb:Te=0.4-z:z:1.6:3 were used instead of the mixtures of Bi, In, Sb, and Te having a mole ratio of Bi:In:Sb:Te.

Comparative Example

Manufacture of $Bi_{0.4}Sb_{1.6}Te_3$

A bulk thermoelectric material of the formula $Bi_{0.4}Sb_{1.6}Te_3$ was manufactured using the same method used in Examples 1 to 8 except that a mixture of Bi, Sb, and Te having a mole ratio of Bi:Sb:Te=0.4:1.6:3 was used instead of the Bi, In, Sb, and Te having a mole ratio of Bi:In:Sb:Te=0.4-z:z:1.6:3.

Evaluation

FIGS. 3A through 3E are graphs showing the results of analysis of electrical conductivities, Seebeck coefficients, power factors, thermal conductivities, and figures of merit (ZTs) according to temperature for the thermoelectric materials according to Examples 1 through 8 and a Comparative Example. The electrical conductivity, Seebeck coefficient, thermal conductivity, and ZT were determined according to standard methods, which are described in the "CRC Handbook of Thermoelectrics," D. M. Rowe, ed., CRC Press (1995), the content of which in its entirety is herein incorporated by reference. The figures of merit (ZTs) were measured in a temperature range of about 320 K to about 440 K. For measuring the electrical conductivities, a DC 4-probe method was used, for measuring the Seebeck coefficients, a static temperature difference method was used, and for measuring thermal conductivities, a laser flash method was used. At this point, all of the electrical conductivities, the Seebeck coefficients, and the thermal conductivities were measured in a direction perpendicular to the pressing direction.

Referring to FIGS. 3A through 3E, the electrical conductivities are higher in Examples 1 to 6, which correspond to z=0.001, 0.0015, 0.002, 0.0025, 0.003, and 0.005, respectively, than the Comparative Example (i.e., when z=0). The Seebeck coefficient is higher in Example 2 (when z=0.0015) than in the Comparative Example. The power factors in Examples 1-3 (z=0.001, 0.0015, and 0.002, respectively) are higher than the Comparative Example (i.e., when z=0). The thermal conductivities of Examples 1-8 are lower than the Comparative Example at 400 K and 440 K and the thermal conductivities of Examples 2-8 are lower than the Comparative Example at 320K, i.e., when the mole fraction of In is equal to or greater than 0.0015. At 320 K to about 360 K, the figures of merit (ZTs) of Examples 1-7 are higher than in the Comparative Example. At 400K and 440K, the figures of merit of Examples 2-8 are higher than in the Comparative Example. The highest figure of merit ZT, which is about 30% higher than that of the Comparative Example, is provided in Example 2 when the mole fraction of In is 0.0015.

FIGS. 4A through 4E are graphs showing measured electrical conductivities, Seebeck coefficients, power factors, thermal conductivities, and figures of merit (ZTs) of the thermoelectric materials according to Embodiments 9 through 13 and a Comparative Example at 320K to 440 K. The figures of merit (ZTs) were measured in a temperature range from about 320 K to 440 K.

Referring to FIGS. 4A through 4E, Examples 9 to 13 and the Comparative Example show that the electrical conductivities are similar to each other when the mole fraction of Ga is 0.001 and 0.003 in $Bi_{0.4-z}A_zSb_{1.6}Te_3$, and as the mole fraction of Ga increases to 0.005, 0.01, and 0.02, the electrical conductivities in the Examples are reduced. The values of the Seebeck coefficients in Examples 9 and 10 and the Comparative Example increased with increasing temperature, and the Seebeck coefficients of Examples 10-13 were higher than in the Comparative Example at 320 K to 400 K. The Seebeck coefficients are slightly reduced at a temperature of 440 K when the mole ratio of Ga is 0.003. Also, when the mole fraction of Ga is greater than 0.005, the Seebeck coefficients are slightly increased at a temperature of 360 K as compared to is the Seebeck coefficients at 320 K. At a temperature greater than 400K, the Seebeck coefficients decreased for Examples 10-13. When the mole fraction of Ga is greater than 0.005, the Seebeck coefficients in Examples 12-13 are higher than that of the Comparative Example at temperatures of 320 K and 360 K. However, due to the rapid reduction of the Seebeck coefficients, a Seebeck coefficient difference between the Examples and the Comparative Example is reduced at a temperature of 400 K. Also, at a temperature of 440 K, Examples 10, 11, and 13 have a Seebeck coefficient smaller than that of the Comparative Example. Power factors of the Examples are higher than in the Comparative Example when the mole fraction of Ga is 0.001 and 0.003. The Examples have thermal conductivities lower than that of the Comparative Example at all mole fractions of Ga. Also, as the mole fraction of Ga increases, the thermal conductivities are further reduced. The figures of merit (ZTs) decrease as the temperature increases for all mole fractions of Ga. However, the highest figure of merit ZT is shown when the mole fraction of Ga is 0.005. The figures of merit (ZTs) in Examples 9-13 are higher than in the Comparative Example at all mole fractions of Ga except when the mole fraction of Ga is 0.02.

Figure 5:
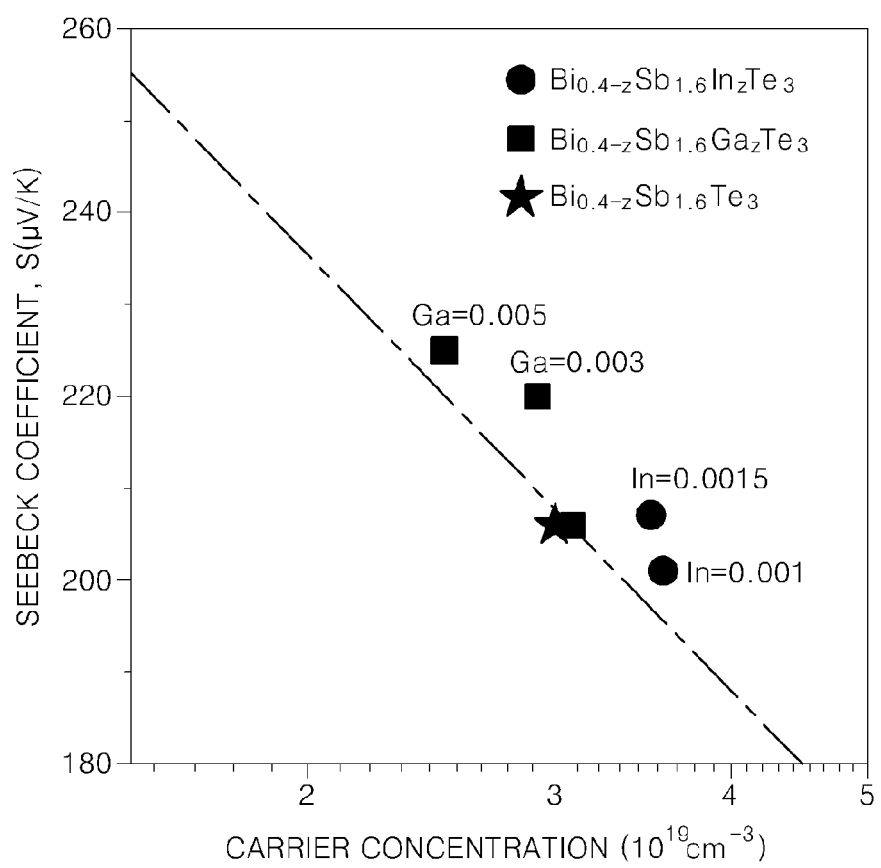
FIG. 5 is a graph showing Seebeck coefficient, S (microvolts per Kelvin, μV/K) versus carrier concentration (charge density, $10^{19}$ per cubic centimeter, $10^{19}$ cm$^{-3}$) of $Bi_{0.4-z}A_zSb_{1.6}Te_3$ wherein A=Ga or In, and $Bi_{0.4-z}A_zSb_{1.6}Te_3$, at a temperature of 300 K.

FIG. 5 is a graph showing Seebeck coefficients at various carrier concentrations (i.e., charge density) for $Bi_{0.4-z}A_zSb_{1.6}Te_3$ (A=Ga, or In) at a temperature of 320 K. FIG. 5 shows variation of Seebeck coefficients according to charge density of a thermoelectric material in Example 1 (z=0.001), Example 2 (z=0.0015), Example 10 (z=0.003), Example 11 (z=0.005), and the Comparative Example at a temperature of 320 K. In FIG. 5, the dashed line indicates Seebeck coefficients according to the charge concentration of $Bi_{2-z}Sb_zTe_3$. While not wanting to be bound by theory, it is understood that when a Seebeck coefficient is located above the dashed line, the Seebeck coefficient is greater than $Bi_{2-z}Sb_zTe_3$ at a given carrier concentration.

Referring to FIG. 5, the Seebeck coefficient of the Comparative Example is located on the dashed line, but all of the Seebeck coefficients of Examples 1, 2, 10, and 11 are located above the dashed line. This denotes that the thermoelectric material according to the Comparative Example has a Seebeck coefficient the same as $Bi_{2-z}Sb_zTe_3$ at the same charge concentration; however, thermoelectric materials according to Example 1, 2, 10, and 11 have Seebeck coefficients higher than the $Bi_{2-z}Sb_zTe_3$ at the same charge concentration. Accordingly, it is seen that the thermoelectric materials according to Examples 1, 2, 10, and 11 have Seebeck coefficients higher than that of the thermoelectric material according to the Comparative Example. While not wanting to be bound by theory, it is understood that this is because a chemical potential of the thermoelectric material is changed due to the addition of Ga or In. Thus the position of Fermi energy is moved, and as a result an electron effective mass is increased, increasing the Seebeck coefficient. In particular, the increase in the Seebeck coefficient is the greatest when the mole fraction of In is 0.0015, or when the mole fraction Ga is 0.003, in a thermoelectric material.

It should be understood that the exemplary embodiments described herein should be considered in a descriptive sense only and not for purposes of limitation. Descriptions of features or aspects within each embodiment should be considered as available for other similar features or aspects in other embodiments.

What is claimed is:

1. A thermoelectric material comprising a composition according to Chemical Formula 1:

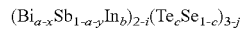
              Chemical Formula 1

$(Bi_{a-x}Sb_{1-a-y}In_b)_{2-i}(Te_cSe_{1-c})_{3-j}$ wherein $0 \le a \le 1$, $0 < b \le 0.004$, $0 \le x \le b$, $0 \le y \le b$, $x+y=b$, $0 \le c \le 1$, $-0.2 \le i \le 0.2$, and $-0.2 \le j \le 0.2$.

2. The thermoelectric material of claim 1, wherein b is $0.0005 \le b \le 0.004$.

3. The thermoelectric material of claim 1, wherein the thermoelectric material has a charge density in a range from about $1 \times 10^{19}$ cm$^{-3}$ to about $10 \times 10^{19}$ cm$^{-3}$ at a temperature of 300 K.

4. The thermoelectric material of claim 1, wherein the thermoelectric material comprising a composition according to Chemical Formula 1 is a first thermoelectric material, and a potential difference between the first thermoelectric material and a second thermoelectric material comprising a composition according to Chemical Formula 1 in which a, c, x, y, i, and j are the same as a, c, x, y, i, and j of the first thermoelectric material and b of the second thermoelectric material is 0 is in a range from about 0.1 eV to about 1 eV.

5. The thermoelectric material of claim 4, wherein a potential difference between the first thermoelectric material and the second thermoelectric material is in a range from about 0.1 eV to about 0.6 eV.

6. The thermoelectric material of claim 1, wherein the thermoelectric material has a figure of merit in a range from about 1.1 to about 1.4 at 300 K.

7. The thermoelectric material of claim 1, wherein the thermoelectric material is a sintered body.

8. The thermoelectric material of claim 1, wherein the thermoelectric material is a powder.

9. The thermoelectric material of claim 1, wherein the thermoelectric material is an n-type semiconductor or a p-type semiconductor.

10. A thermoelectric material comprising a composition according to Chemical Formula 2:

    Chemical Formula 2 wherein $0<b\leq0.004$, $0\leq x\leq b$, $0\leq y\leq b$, $x+y=b$, $-0.2\leq i\leq0.2$, and $-0.2\leq j\leq0.2$.

11. The thermoelectric material of claim 10, wherein b is $0.0005\leq b\leq0.004$.

12. The thermoelectric material of claim 10, wherein the thermoelectric material has a figure of merit in a range from about 1.1 to about 1.4 at 300 K.

13. The thermoelectric material of claim 10, wherein the thermoelectric material is a sintered body or a powder.

14. A method of manufacturing a thermoelectric material comprising a composition according to Chemical Formula 1:

    Chemical Formula 1 wherein $0\leq a\leq 1$, $0<b\leq0.004$, $0\leq x\leq b$, $0\leq y\leq b$, $x+y=b$, $0\leq c\leq 1$, $-0.2\leq i\leq0.2$, and $-0.2\leq j\leq0.2$, the method comprising:
  forming a mixture by contacting Bi, Sb, In, Te, and Se wherein a mole fraction of each of the Bi, Sb, In, Te, and Se are according to Chemical Formula 1;
  melting the mixture to from a molten mixture;
  cooling the molten mixture to form an alloy comprising a composition according to Chemical Formula 1; and
  grinding the alloy to manufacture the thermoelectric material.

15. The method of claim 14, further comprising sintering the ground alloy.

16. The method of claim 14, further comprising sieving the ground alloy to provide a sorted powder having a particle diameter of 50 microns or less.

17. A device comprising the thermoelectric material of claim 1.

18. The thermoelectric material of claim 1, wherein the composition according to Chemical Formula 1 is of the formula $Bi_{0.4-z}In_zSb_{1.6}Te_3$, wherein $0.001\leq z\leq0.02$.

* * * * *